United States Patent [19]

Fazan et al.

[11] Patent Number: 5,057,888
[45] Date of Patent: Oct. 15, 1991

[54] DOUBLE DRAM CELL

[75] Inventors: Pierre C. Fazan; Hiang C. Chan; Yauh-Ching Liu; Gurtej S. Sandhu; Howard E. Rhodes, all of Boise, Id.

[73] Assignee: Micron Technology, Inc., Boise, Id.

[21] Appl. No.: 646,261

[22] Filed: Jan. 28, 1991

[51] Int. Cl.⁵ ............... H01L 29/68; H01L 29/78; H01L 29/92
[52] U.S. Cl. ................... 357/23.6; 357/23.7; 357/51
[58] Field of Search .......... 357/23.7, 23.6, 23.6 G, 357/59 E, 51; 437/915

[56] References Cited

U.S. PATENT DOCUMENTS

| | | | |
|---|---|---|---|
| 4,630,089 | 12/1986 | Sasaki et al. | 357/23.7 |
| 4,669,062 | 5/1987 | Nakano | 357/23.7 |
| 4,698,659 | 10/1987 | Mizutani | 357/23.7 |
| 4,760,036 | 7/1988 | Schubert | 437/9 |
| 4,771,323 | 9/1988 | Sasaki | 357/23.6 |
| 4,864,464 | 9/1989 | Gonzalez | 361/311 |
| 4,960,723 | 10/1990 | Davies | 437/41 |
| 4,960,726 | 10/1990 | Lechaton | 437/59 |
| 4,960,727 | 10/1990 | Mattox | 437/67 |

FOREIGN PATENT DOCUMENTS 62-211946 9/1987 Japan .................... 357/23.6

Primary Examiner—Andrew J. James
Assistant Examiner—Sara W. Crane
Attorney, Agent, or Firm—Stephen A. Gratton; Robert A. de Groot

[57] ABSTRACT

A double dynamic random access memory (DRAM) cell comprising two vertically stacked access transistors and storage capacitors. A first access transistor is formed on a silicon substrate. A seed contact to the first access transistor is then utilized for growing an intermediate silicon substrate by Confined Lateral Selective Epitaxial Overgrowth (CLSEG). A second access transistor is formed upon the intermediate silicon substrate. A storage capacitor for the first access transistor may be formed as a trench capacitor in the silicon substrate. A storage capacitor for the second access transistor may be stacked on the second access transistor. A common buried bit line connects the two access transistors.

16 Claims, 11 Drawing Sheets

DOUBLE DRAM CELL

FIELD OF THE INVENTION

This invention relates to semiconductor devices and, more particularly, to a dynamic random access memory DRAM cell having two vertically stacked access transistors and corresponding storage capacitors for doubling memory storage capacity within a chip surface area.

BACKGROUND OF THE INVENTION

The invention uses various materials which are electrically either conductive, insulating, or semiconducting, although the completed semiconductor circuit device itself is usually referred to as a "semiconductor". One of the materials used is silicon, which is used as either single crystal silicon or as polycrystalline silicon material, referred to as polysilicon or "poly" in this disclosure.

The storage capacity of a memory chip is dependent on the number of memory cells in the chip. Dynamic random-access memory DRAM cells are comprised of two main components, a field effect transistor (FET) and a storage capacitor. The field effect transistor (FET) and storage capacitor are generally located in a horizontal plane formed mostly on the surface of the chip. In DRAM cells utilizing a conventional planar capacitor, such as the one depicted in FIG. 1, a large chip area is dedicated to the planar capacitor and field effect transistor (FET).

Recently, research has been directed to three-dimensional Complementary Metal-Oxide Semiconductor CMOS integration to improve component density in memory chips. Three-dimensional integration significantly increases the circuit densities of monolithically integrated systems. One such three-dimensional technique for a transistor-capacitor DRAM cell involves the creation of "trench" capacitors in the cell substrate. FIG. 2 depicts a DRAM memory cell formed with a typical trench capacitor. Similar in concept to the planar capacitor of FIG. 1, a vertical trench is employed to form the capacitor plate with the expenditure of less surface area.

A second three-dimensional technique is to stack a capacitor on top of the transistor. In this type of stacked structure, the chip area is shared between the transistor and the capacitor as seen in FIG. 3. In both cases (trench capacitor or stacked structure), standard silicon technology can be utilized to form the circuits.

Some research has also been done on structures which includes a CMOS invertor with the PMOS stacked on top of the NMOS, and a shared gate sandwiched between the two devices. The top substrate of the stacked device is formed of polysilicon. A problem with the use of polysilicon in this application is that, because of the high recrystallization temperature of polysilicon, large processing temperature gradients are required. These temperature gradients induce large defect densities in the cell structure.

One recent technique for developing a stacked or intermediate active monocrystalline device layer is by selective epitaxial growth (SEG) and epitaxial lateral overgrowth (ELO) of monocrystalline silicon. These techniques involve relatively low processing temperatures (i.e., 900° C.) so that fewer cell defects are formed.

In general, (SEG) and (ELO) involve low temperature epitaxy to limit silicon growth and produce intermediate substrates or device islands. To produce (SEG), seed contacts are opened on an oxidized silicon substrate. Epitaxial growth is then initiated selectively in the seed contacts and progresses vertically until it reaches the level of the oxide and then grows laterally over the insulating oxide film (ELO). This produces a single crystal silicon layer. This layer can then be planarized by known techniques such as chemical-mechanical polishing. Such SEG/ELO techniques are described in U.S. Pat. No. 4,760,036 to Schubert and in the technical article "Three-Dimensional CMOS Integration" contained in IEEE Circuits And Devices Magazine, September 1990.

It is not necessary to planarize an intermediate substrate if the (ELO) is confined inside cavities, such that lateral growth is maintained while restricting vertical growth. This (SEG) technique is termed "confined lateral selective epitaxial growth" (CLSEG).

The present invention is directed to a novel three-dimensional DRAM cell in which a (CLSEG) process is utilized to form an intermediate substrate or island. An access transistor can be formed on this intermediate substrate, stacked upon an access transistor previously formed on the main substrate. This forms a double-memory cell and for a given chip area more than doubles the memory capacity.

SUMMARY OF THE INVENTION

In accordance with the present invention, a double DRAM cell including two vertically stacked access transistors with corresponding storage capacitors is provided. The DRAM cell comprises a first access transistor formed on a silicon substrate in a conventional manner. A second access transistor is vertically stacked upon the first access transistor by formation on a substrate grown by a SEG/ELO process. A seed contact to the first access transistor is formed as a seed for epitaxially growing the intermediate substrate. The seed contact is located such that both access transistors can be connected to a single bit line. Capacitors for the vertically stacked transistors can both be stacked on the access transistors or one capacitor can be trenched and the second capacitor stacked.

In an illustrative embodiment of the invention, a double DRAM cell having two stacked access transistors, with a trench storage capacitor for the first access transistor and a stacked storage capacitor for the second access transistor can be formed by a process which includes the steps of:

1. forming a first access transistor and gate on a silicon substrate and forming a trench storage capacitor for the first access transistor;

2. forming a self-aligned seed contact to a drain of the first access transistor;

3. forming an intermediate substrate for the second access transistor by a (CLSEG) process utilizing the seed contact to the first access transistor;

4. forming the gate of the second access transistor and doping the source and drain regions of the second access transistor from the intermediate substrate;

5. forming a self-aligned contact to the drain of the second access transistor such that a bit line can be formed as a common contact between both access transistors;

6. forming a second storage capacitor for the second access transistor stacked upon the second access transistor.

This process forms two stacked transistors or a dual gate cell with a trench and a stacked storage capacitor.

Other objects, advantages, and capabilities of the present invention will become more apparent as the description proceeds.

BRIEF DESCRIPTION OF THE DRAWINGS

Each of the FIGS. 1-19 depict a cross-sectional view of a DRAM cell. FIGS. 1-3 depict existing technology, while

FIG. 1 is a cell having a conventional planar capacitor;

FIG. 2 is a cell having a conventional trench capacitor;

FIG. 3 is a cell having a conventional stacked capacitor;

FIGS. 4-8 show the formation of a trench capacitor and field isolation upon a silicon substrate;

FIGS. 9 and 10 show the formation of a trench capacitor and a first access transistor;

FIG. 11 shows the formation of a self-aligned seed contact to the first access transistor;

FIG. 12-16 shows the formation of an intermediate substrate for a second access transistor by Confined Lateral Selective Epitaxial Overgrowth (CLSEG);

FIGS. 17 show the formation of a second access transistor on the intermediate substrate;

FIG. 18 shows the formation of a self-aligned contact and buried bit line to the second access transistor;

FIG. 19 shows the formation of a second capacitor stacked on the second access transistor and the completed double DRAM cell.

DETAILED DESCRIPTION OF THE INVENTION

In the description of the invention "n" and "p" are used, where appropriate, with "+" and "−" modifiers, to define relative dopant types and concentrations. In describing insulated-gate transistors, "field effect transistor" (FET) is used interchangeably with "access transistor" and with "metal oxide semiconductor" (MOS). The process of the invention can be utilized to construct either p-n-p or n-p-n devices. The figures illustrate both cases. A p-n-p device is indicated without parentheses, and an n-p-n device is indicated with parentheses.

Figure 1:
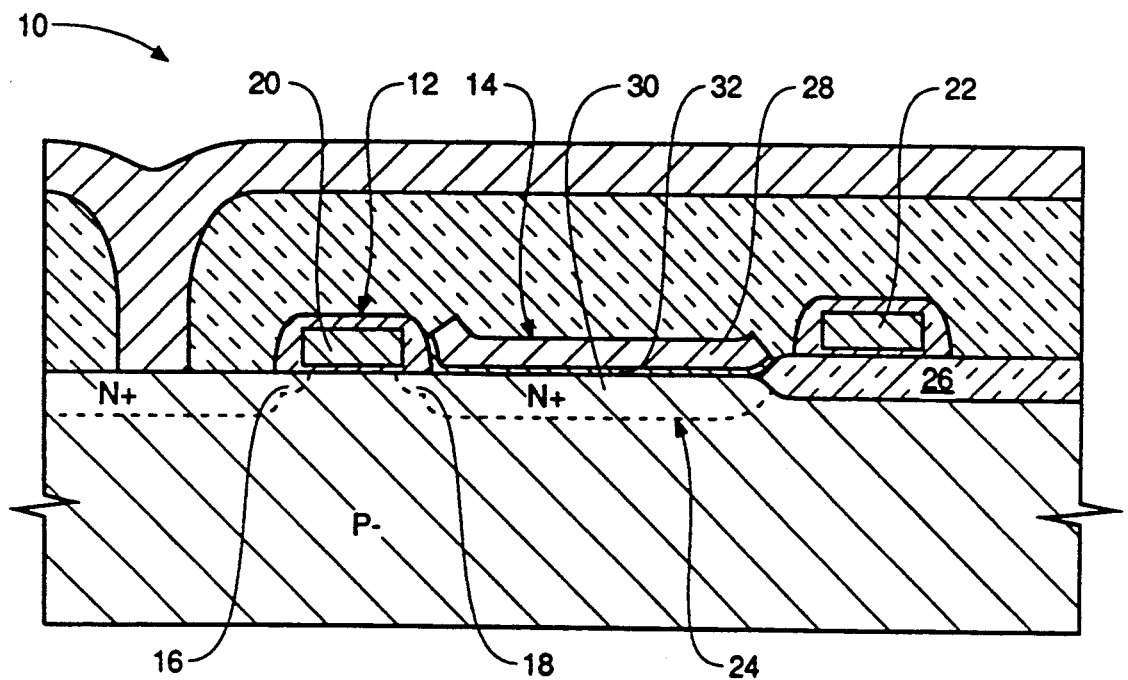

Referring now to FIG. 1, a prior art DRAM cell 10 having an access transistor (FET) 12 and a planar capacitor 14 is shown. The access transistor (FET) 12 includes a source 16 and a drain 18. A word line gate 20 and interconnect word line 22 are formed from a polycrystalline silicon-1 layer. An n+ silicon substrate extension 24 of drain 18 lies in the cell region adjacent to a field oxide layer 26. An upper capacitor plate 28 and a lower capacitor plate 30 formed on the substrate are separated by a dielectric 32. As is apparent, this prior art arrangement dedicates a large chip surface area to the (FET) 12 and storage capacitor 14.

Figure 2:
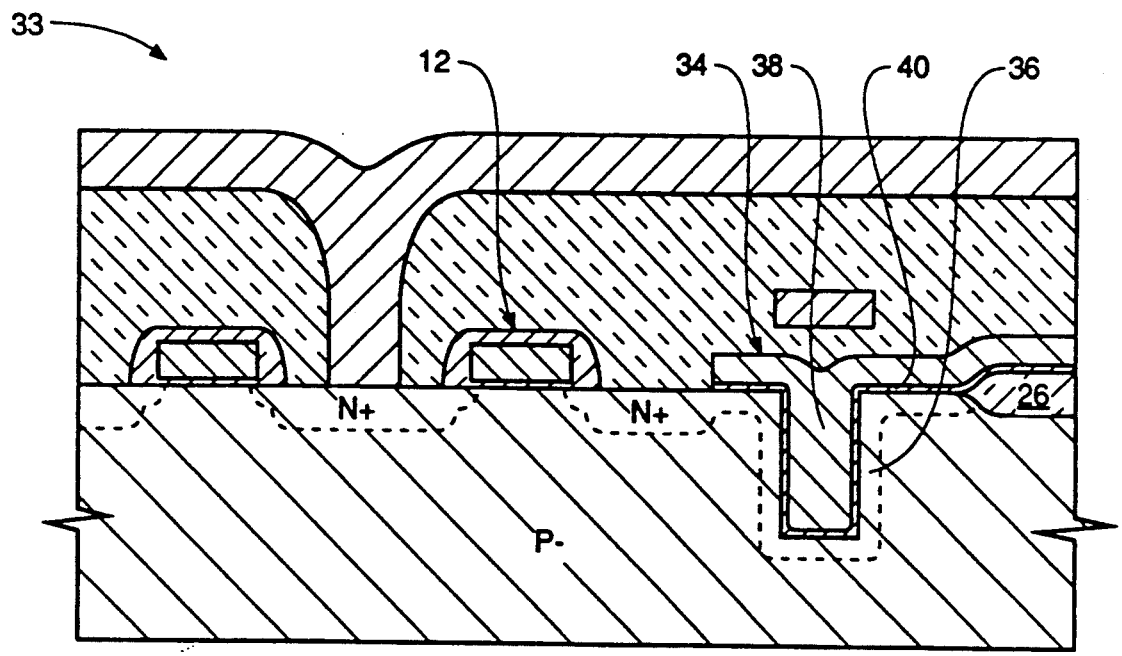

FIG. 2 depicts a DRAM cell 33 having an (FET) 12 and a typical trench capacitor 34. Similar in concept to planar capacitor 14 of FIG. 1, a trench is employed to provide greater plate area and, hence, greater capacitance. The lower plate 36 is still formed from an n+silicon substrate while the upper plate 38 is formed from a layer of n-type polycrystalline silicon. Lower plate 36 and upper plate 38 are electrically insulated by a dielectric layer 40.

Figure 3:
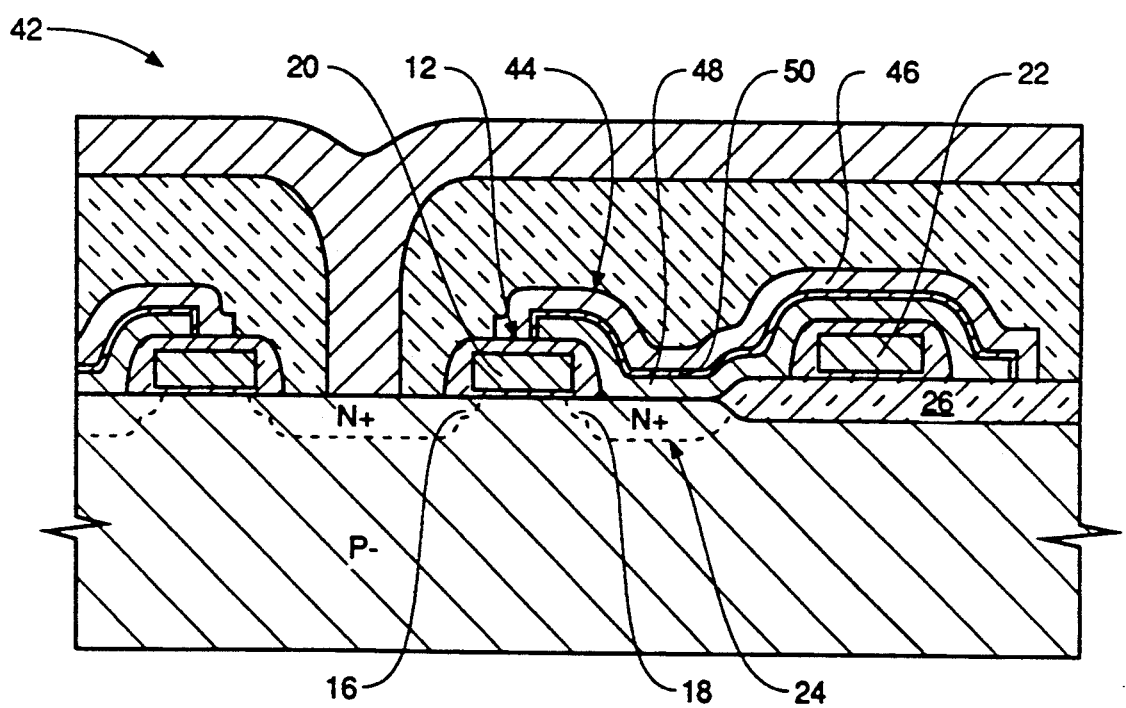

FIG. 3 depicts a DRAM cell 42 having an (FET) 12 and a storage capacitor 44 stacked on the DRAM cell 42 surface. The capacitor 44 includes an upper plate 46 and a lower plate 48 made from n-type polycrystalline silicon layers and separated by a dielectric layer 50.

The present invention is directed to a DRAM cell construction in which two access transistors (FETs) are vertically stacked to provide a double cell. Storage capacitors for the two access transistors may be either both stacked on the access transistors or one can be trenched and the second one stacked. A process sequence for forming a double DRAM cell having a trench storage capacitor and a stacked storage capacitor is shown in FIGS. 4-19. As shown throughout either (p) or (n) type material, preferably silicon, may be used.

Figure 4:
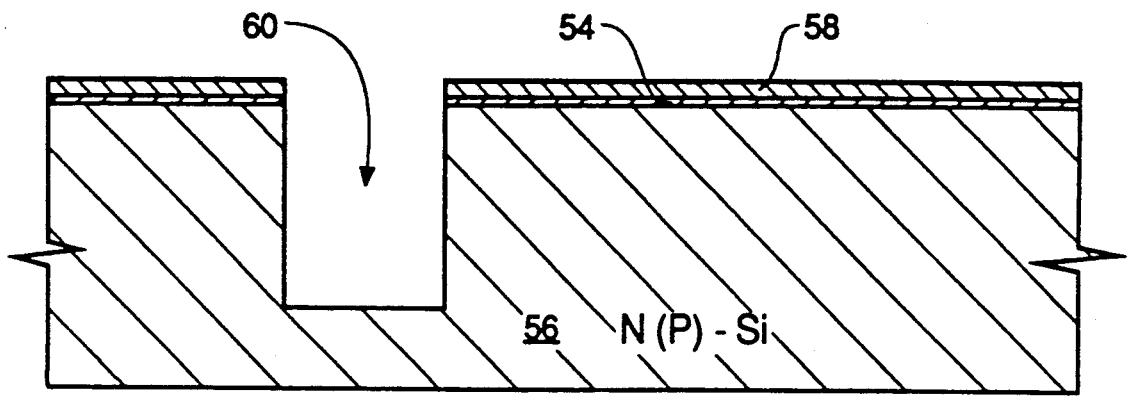
FIGS. 4-19 depict the formation in accordance with the invention of a double access cell having a trench storage capacitor for a first access transistor and a stacked storage capacitor for a second access transistor.
Figure 5:
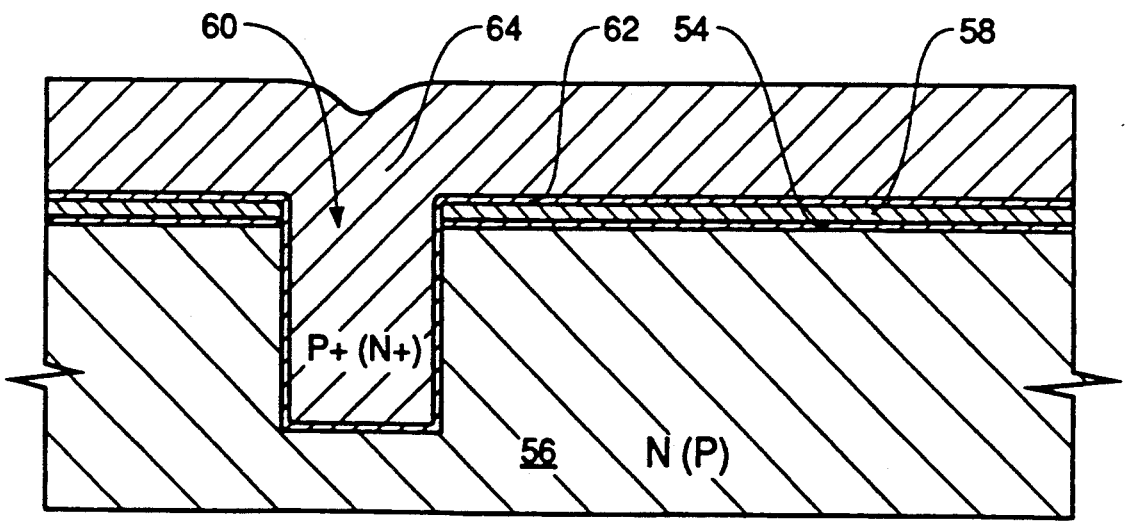
Figure 6:
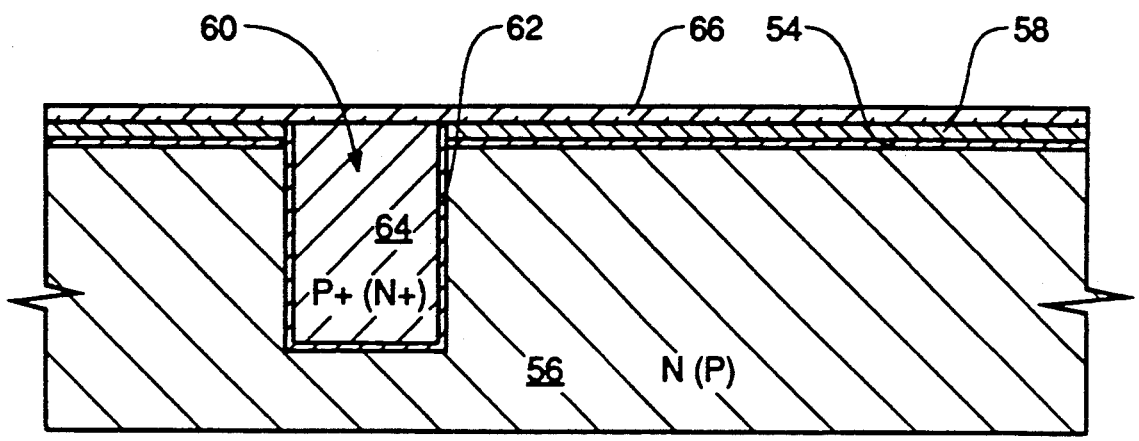

Referring now to FIGS. 4-8, steps necessary for forming a trench capacitor (Cl) are shown. With reference to FIG. 4, a thin (about 200-500 Å) pad oxide layer 54 is first grown on the substrate 56 of a silicon wafer. This is followed by the deposition (i.e., Low Pressure Chemical Vapor Deposition process LPCVD) of a pad nitride layer 58. A masking step is used to make a hole in these pad nitride 58 and pad oxide 54 layers and the Si substrate 56 is etched to form a trench 60 (FIG. 4).

Next (FIG. 5), a thin dielectric 62, which is the insulator of the first capacitor (Cl), is deposited into the trench 60. This layer has a total thickness of about 40 to 150 Å and can be oxide, nitride, oxidized nitride, or a composite oxide/nitride layer. The trench 60 is then filled with a polysilicon layer 64 which is doped (+) as shown.

Next (FIG. 6), the poly layer 64 is planarized by dry etching techniques in such a way that it fills just the trench 60. Then a second pad oxide layer 66 is deposited.

Next (FIG. 7), a photo step is used to etch the pad oxide 54/pad nitride 58 layers away from some regions that will be used as field oxide regions.

Figure 7:
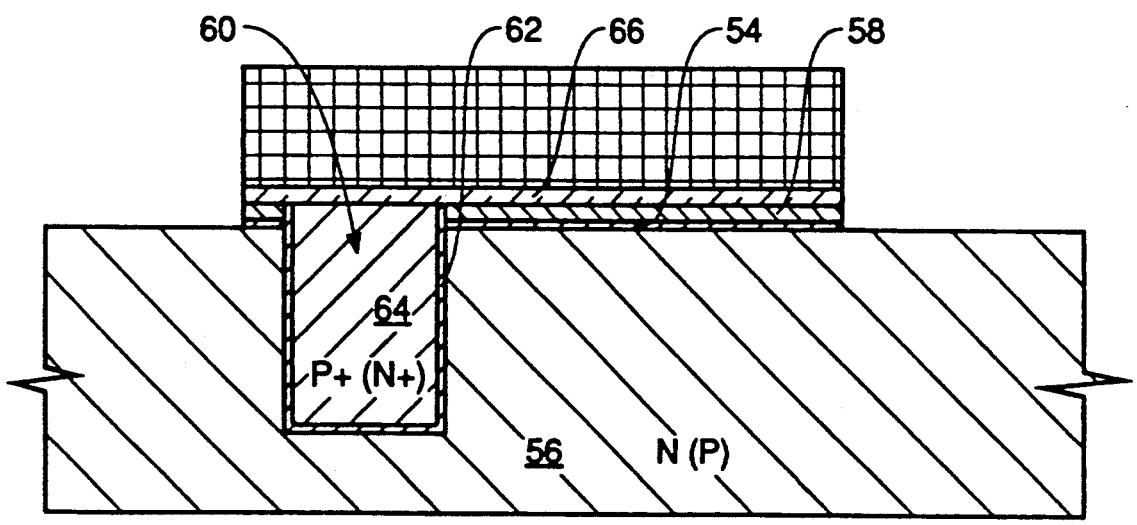
Figure 8:
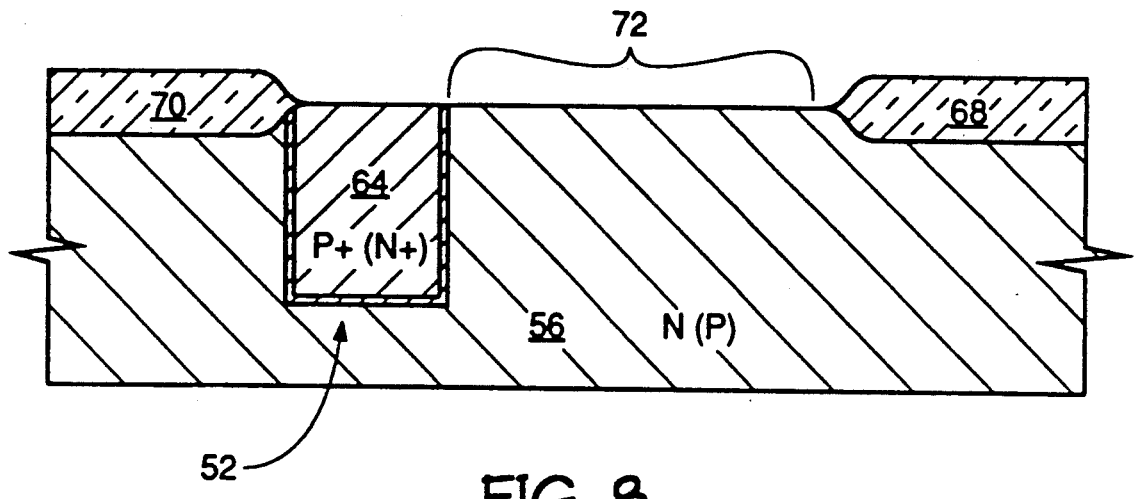
Figure 9:
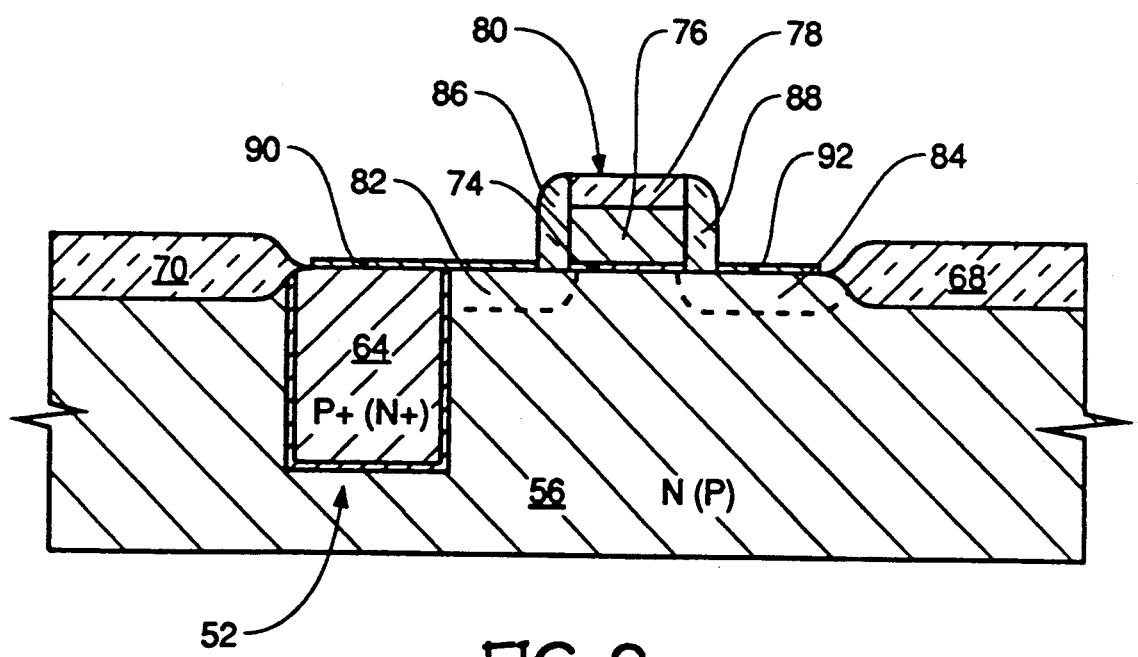

Next (FIG. 8), a wet oxidation process is used to grow a field oxide 68,70 in the regions not protected by the pad layers defined by the photoresist process (FIG. 7). Then the pad layers 54,58 are removed. The wafer now has field oxide regions 68,70 and regions 72 without field oxide which are termed active areas. By way of example, the field oxide is about 2000 to 6000 Å thick.

Next (FIG. 9), the wafer is oxidized to grow a thin gate oxide 74 (ex., about 70-400 Å) everywhere on the active areas 72. A polysilicon layer is then deposited. It can be covered by a silicide layer (WSi2 or other) to form a polycide composite layer 76, about 1000 to 4000 Å thick. An oxide layer 78 (2000 to 5000 Å) is then deposited. All these layers are then etched to form the gate 80 of the first access transistor. As is known in the art, a masking step is used to form the gate 80. This gate 80 also forms the word line (WL1) of the first cell. After gate formation, some implants are performed to create the p+(n+) source 82 and drain 84 regions of the first access transistor. Oxide spacers 86,88 are also created by oxide deposition (about 500 to 3000 Å) and dry etching to isolate the word lines (WL1). During this spacer etch, the gate oxide is removed on the exposed active area regions 72. Then a short selective Si epitaxial growth step creates a connecting strap 90 between the capacitor electrode 64 and the transistor source 82 and covers 92 the transistor drain 84.

Figure 10:
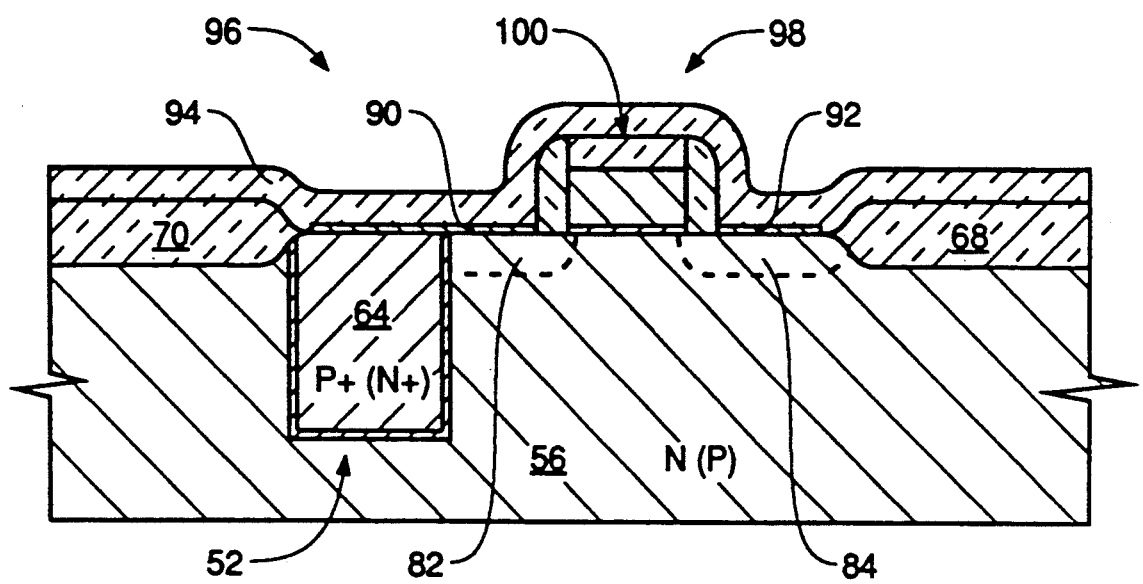

With reference to FIG. 10, an oxide layer 94 (about 1000 to 3000 Å) is then deposited on the wafer. This completes the first cell 96 which includes a first access transistor (T1) 98 and the storage capacitor (Cl) 52. The gate 80 of this first access transistor 98 also forms the word line (WL1) 100 of this first cell 96. As will hereinafter be explained, a common bit line will be formed upon formation of a second cell.

Figure 11:
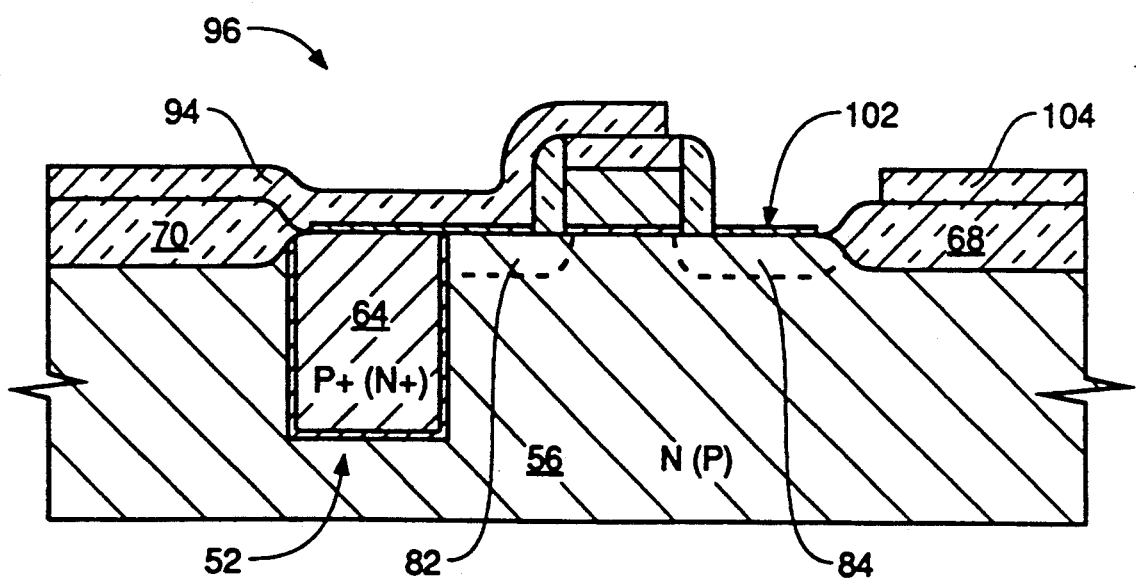
Figure 12:
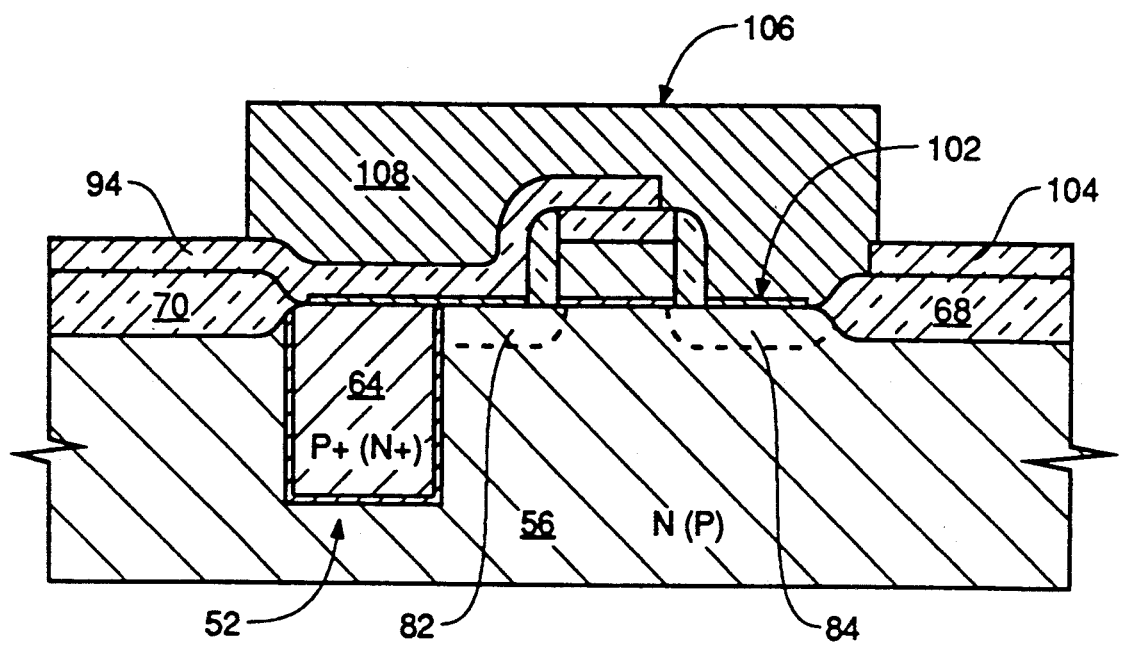

With reference to FIG. 11, a seed contact 102 is opened next for a (CLSEG) process to follow. In forming the seed contact 102, a masking step is utilized to open a hole in the oxide layer 94 previously deposited. This seed contact is self-aligned because it can overlap the gate of the first cell 96 (protected by more oxide) or the field oxide With reference to FIG. 12, an intermediate substrate 106 is formed next utilizing a (CLSEG) process. A (CLSEG) process is described in the previously cited U.S. Pat. No. 4,760,036 and in the previously cited IEEE technical article "Three-Dimensional CMOS Integration". During the (CLSEG) process, a thick sacrificial layer 108 (about 4000 to 6000 Å) is first deposited within seed contact 102 and grown laterally. In the illustrative embodiment, this sacrificial layer is formed of nitride. Alternately a sacrificial layer 108 formed of another material, such as amorphous silicon or polysilicon, may be utilized. This nitride layer 108 is then planarized and etched using a masking step to form a planarized sacrificial nitride block 108 which is shown in FIG. 12.

Figure 13:
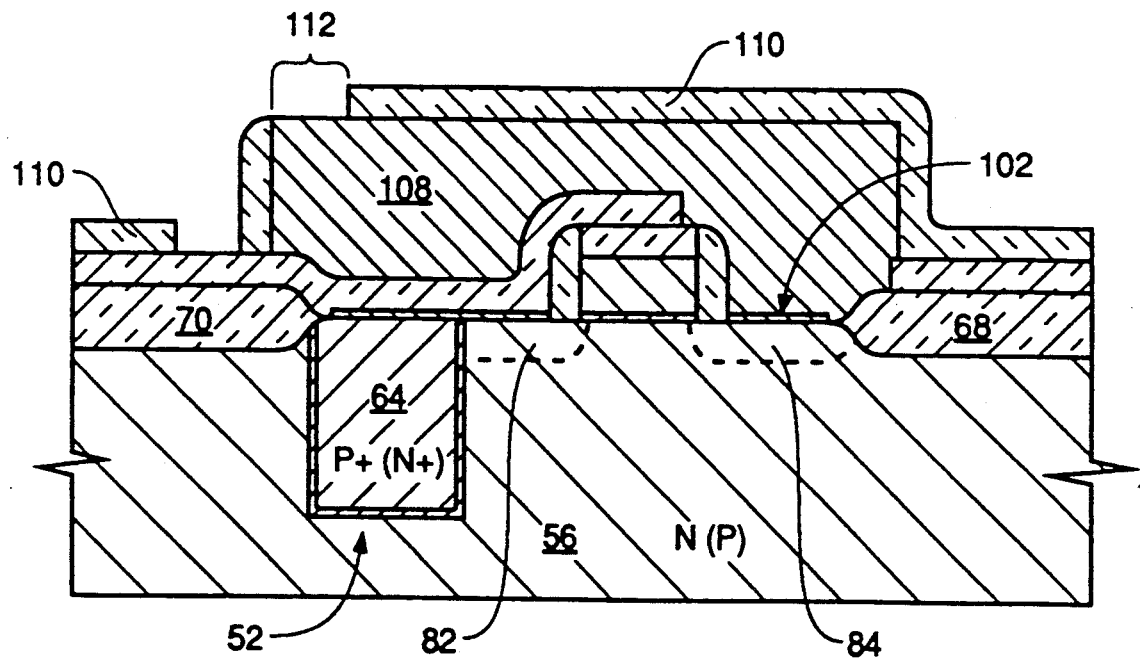

With reference to FIG. 13, an oxide layer 110 (about 1000 to 3000 Å thick) is then deposited on the wafer and an opening 112 is etched to the sacrificial nitride block 108 by using a masking step. This opening 112 is needed to etch away the sacrificial nitride block 108.

Figure 14:
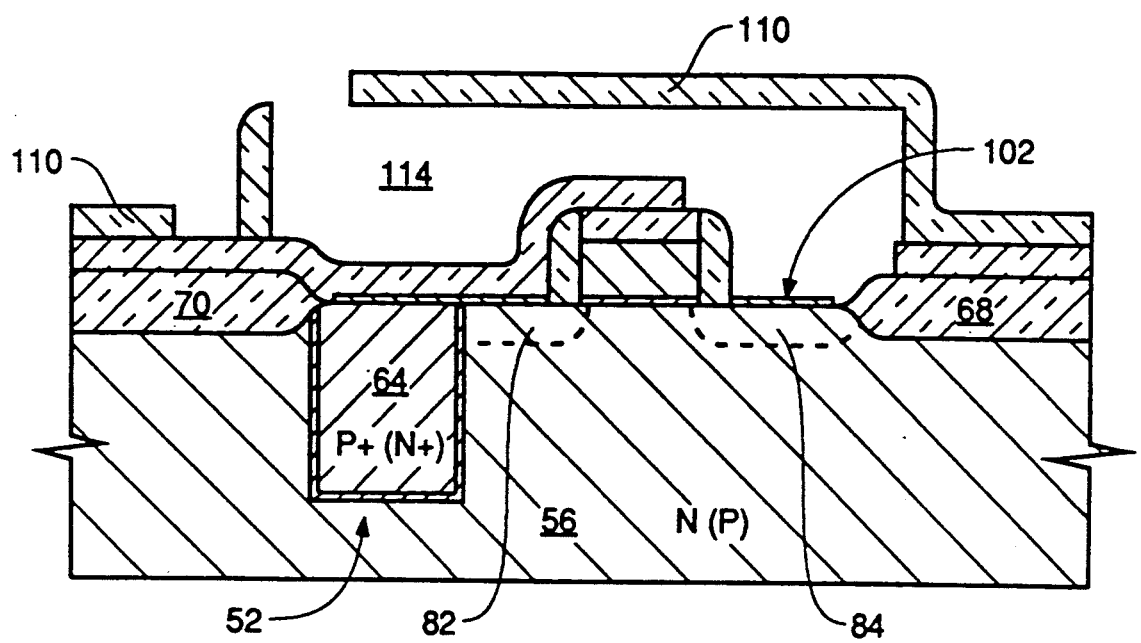

FIG. 14 illustrates the structure after a nitride wet etch to remove the sacrificial nitride block 108. The structure now has a cavity 114 which will be filled by epitaxial Si.

Figure 15:
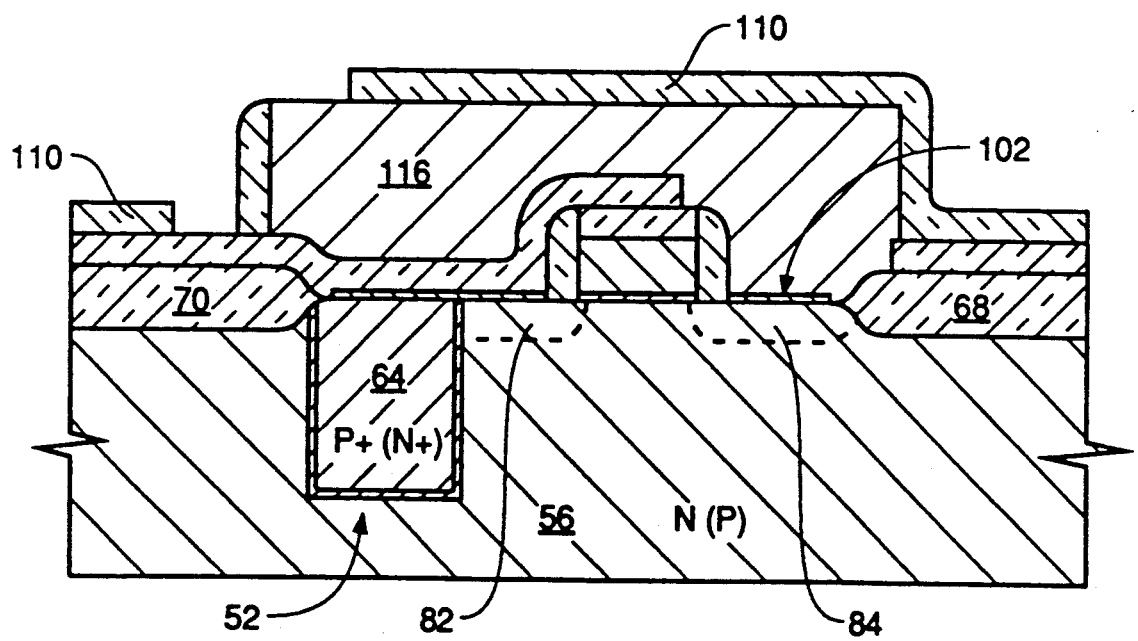

FIG. 15 illustrates the structure after Si epitaxial growth confined by the oxide cavity 114. As shown, an intermediate substrate 116 or (CLSEG) Si block is formed. This intermediate substrate 116 of single crystal silicon will be used as the substrate for the formation of a second access transistor.

Figure 16:
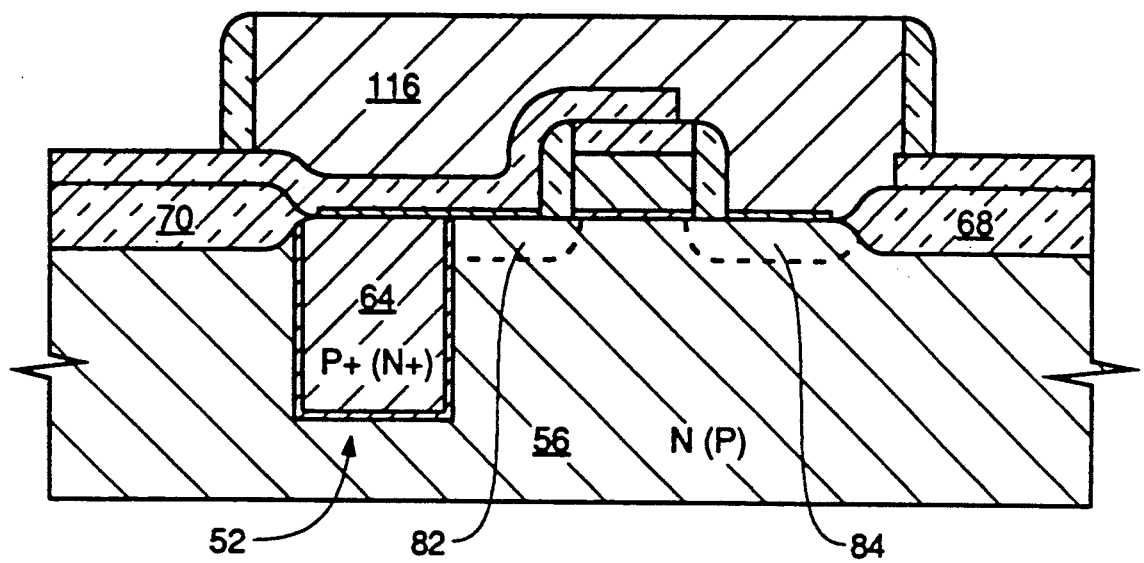

With reference to FIG. 16, an oxide dry etch step is first utilized to clear the oxide layer 110 (FIG. 15) covering the (CLSEG) Si block or intermediate substrate 116.

Figure 17:
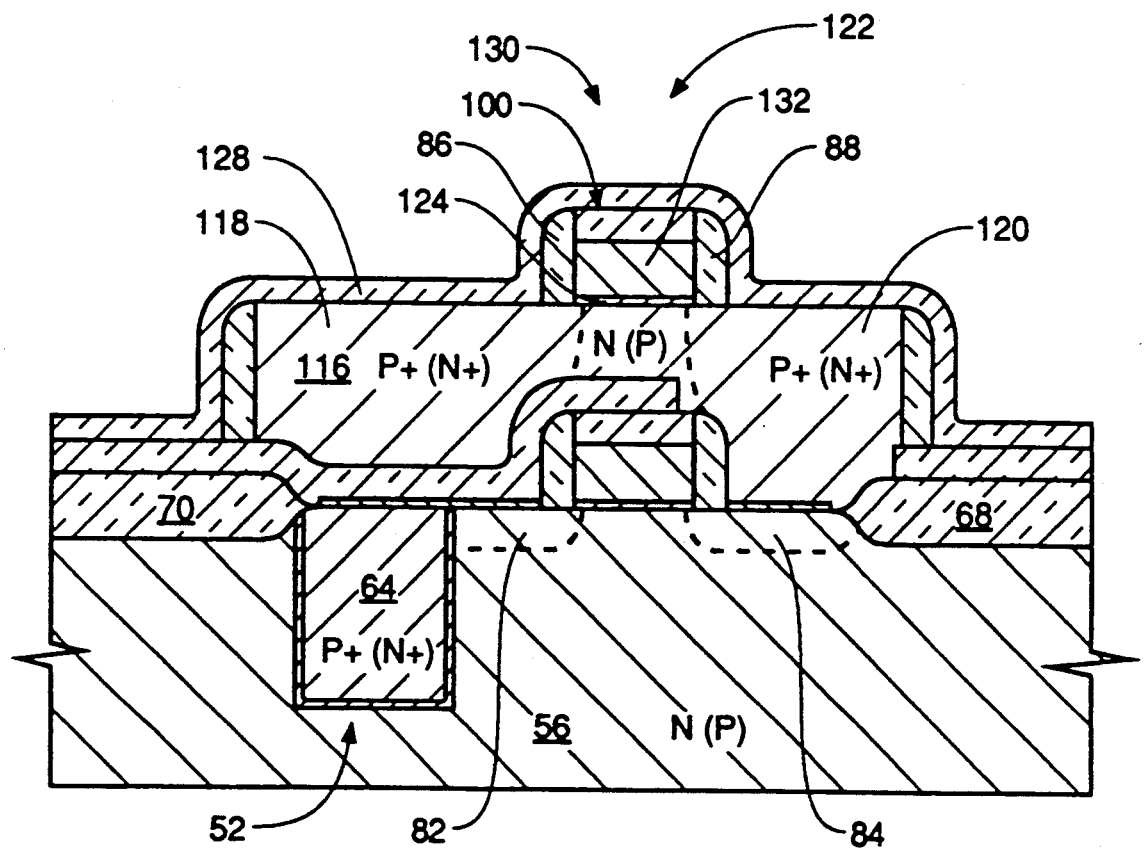

With reference to FIG. 17, formation of a second access transistor 122 is then performed as previously described for the formation of the first access transistor 98 (FIG. 10). The intermediate substrate 116 is doped to provide a source 118 and a drain 120. A gate is then formed to the second access transistor 122. A gate oxide layer 124 is
the wafer. It is approximately 70 to 400 Å thick and completely covers the intermediate substrate 116. As previously described for the first access transistor 98 (FIG. 9), the gate materials are deposited and etched, implants are done and oxide spacers 86,88 are formed. Then a protective oxide 128 (about 500 to 3000 Å) is deposited. This forms the gate 130 and word line (WL2) 132 of the second access transistor 122 or cell.

Figure 18:
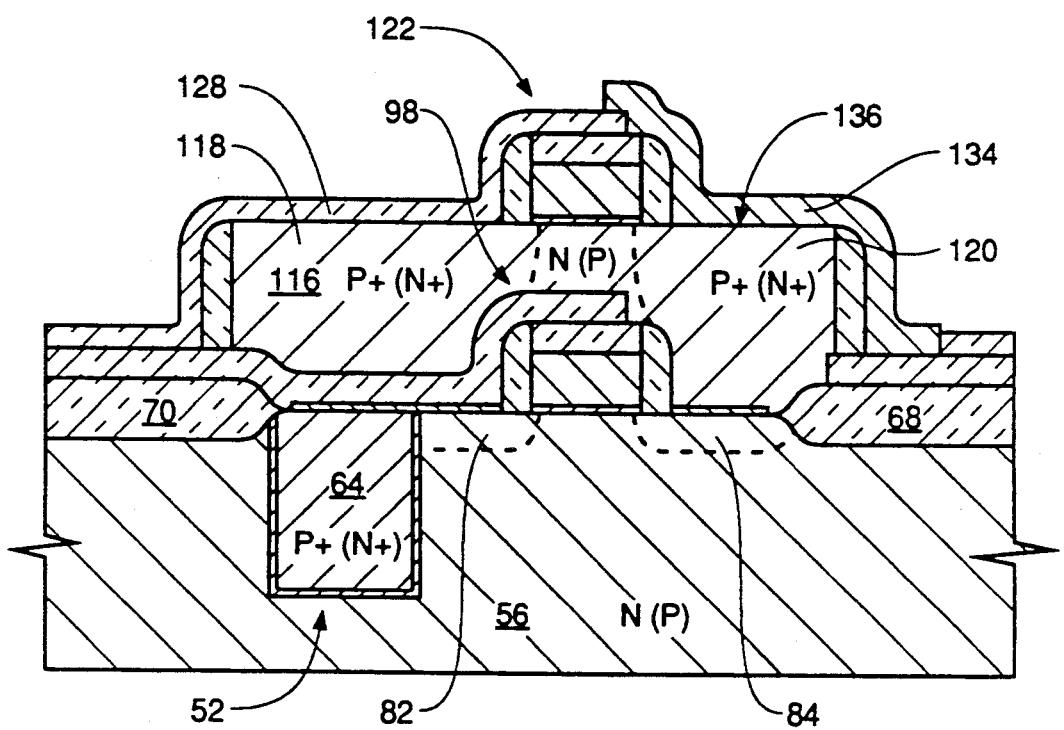

With reference to FIG. 18, a buried digit or bit line 134 is next formed. For forming the bit line 134, a self-aligned bit contact 136 is opened in the oxide layer 128 to the drain 120 of the second access transistor 122. This bit line contact 136 will function as a common contact between both transistors 98,122 which are connected by the location of the seed contact 102 (FIG. 11). The bit line 134 is deposited onto this bit contact 136. The bit line 134 may be formed of a polysilicide layer (about 500 to 3000 Å) doped and covered by a silicon layer (WSi2 or other) about 500 to 2000 Å thick. These layers are then etched utilizing a masking step.

Figure 19:
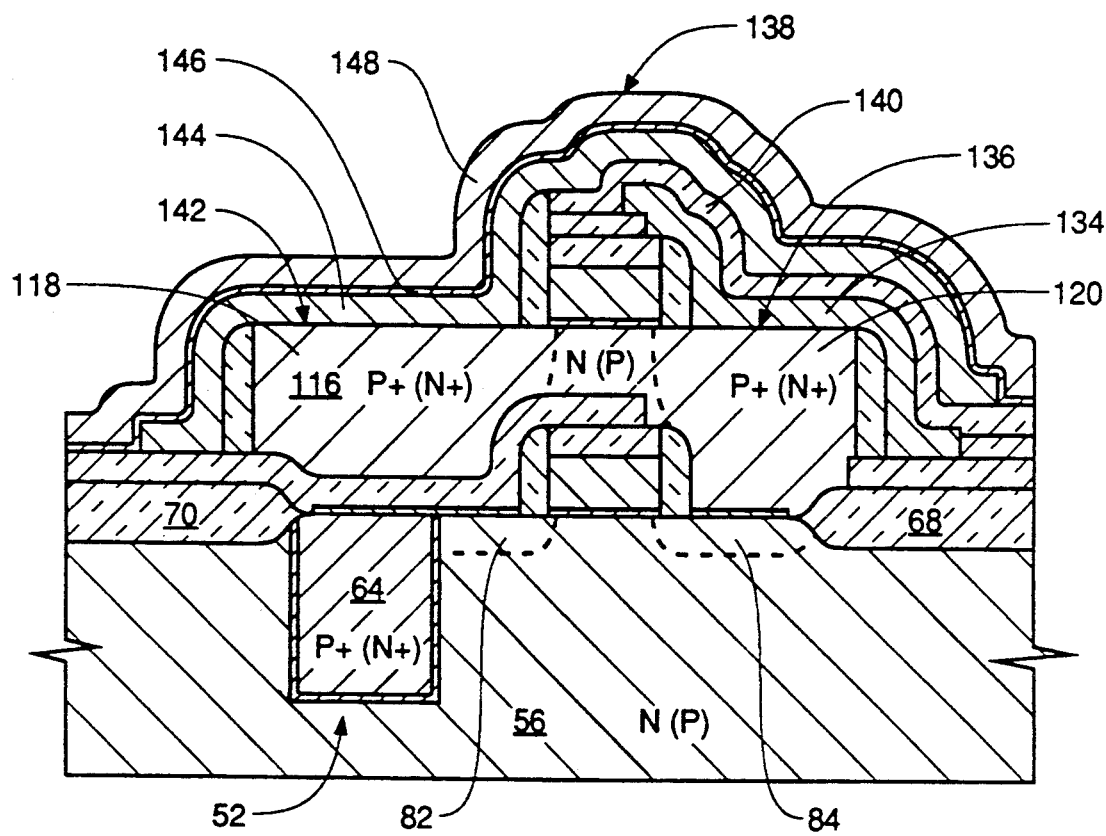

Next, as shown in FIG. 19, a stacked capacitor (C2) 138 for the second access transistor 122 is formed. First, the bit line 134 is isolated by deposition of an oxide layer 140 (500 to 2000 Å). A contact 142 is then opened to the source 118 of the second access transistor 122 which will ultimately contact a bottom plate 144 of the capacitor 138. This contact 142 is opened by using a masking step. After contact etch, a poly layer is deposited, doped, and etched by using one more photo step to form the capacitor bottom plate 144. Then the capacitor cell dielectric 146 is deposited. As previously described, this cell dielectric 146 can be oxide, nitride, oxidized nitride, or oxide/nitride/oxide having a thickness of approximately 40 to 150 Å. The final top capacitor plate 148 is then deposited on the completed array and doped. This completes the double cell memory array which includes the two access transistors, a trench capacitor, and a stacked capacitor.

Figure 20:
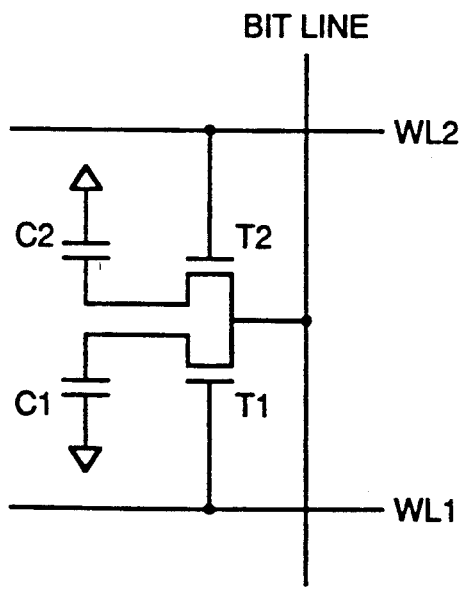
FIG. 20 is an electrical schematic of the double DRAM cell of FIG. 19.

A circuit configuration for this double cell is shown in FIG. 20. As shown, the circuit comprises the first access transistor T1 which is connected to the first word line WL1 and the first storage capacitor Cl, and the second access transistor T2 which is connected to the second word line WL2 and the second storage capacitor C2. Both transistors T2,T1 connect to the bit line at a common point.

A double cell is thus formed having a first access transistor and a second access transistor stacked in the vertical direction. In the illustrative embodiment, the storage capacitor for first access transistor comprises a trench capacitor. Alternately, this capacitor can also be a planar capacitor as shown in FIG. 1 or a stacked capacitor as shown in FIG. 3. Two storage capacitors can also be stacked on each other using a common plate.

In order to form two stacked capacitors having a common plate, another plate (i.e., formed of a polysilicon layer) could be formed on and separated by a dielectric layer from top plate 148. This uppermost plate could be connected to the source 82 of the first access transistor 98 and would in fact replace the p+(n+) poly layer 64 formed in trench capacitor 52. To make this common plate stacked capacitor construction, a slightly different process flow would be needed. In particular, the intermediate substrate 116 grown by the (CLSEG) process, shown in FIGS. 12-16, would be smaller and not completely cover the source 82 of the first access transistor 98.

This novel structure allows more than double the cell density for a given surface area and a given lithograph resolution. Additional surface area is saved because the device isolation is integrated vertically. Another advantage is a reduction in digit line length and, thus, resistance. The digit line length for a given number of cells can be reduced by a factor of two or more, considerably improving device speed. The double cell may be formed with techniques and materials which are known in the art and by use of the (CLSEG) process.

The invention as described herein represents only the preferred embodiment of the device. Other equivalent embodiments are covered within the scope and spirit of the following claims.

WHAT IS CLAIMED IS:

1. A double DRAM cell comprising:
   a first transistor (T1) formed on a substrate;
   a first storage capacitor (C1) connected to the first transistor (T1);
   a first word line (WL1) for the first transistor (T1);
   a first insulating layer covering the first transistor (T1);
   a seed contact formed through the first insulating layer to the first transistor (T1);
   an intermediate substrate formed by a selective epitaxial growth (SEG) epitaxial lateral overgrowth (ELO) process on the seed contact over the first transistor (T1);
   a second transistor (T2) formed on the intermediate substrate;
   a common insulated buried bit line deposited over and connected to the first (T1) and second (T2) transistors;
   a second word line (WL2) for the second transistor (T2); and
   a second storage capacitor (C2) for the second transistor (T2).

2. The double DRAM cell as recited in claim 1 and wherein:
   the intermediate substrate is monocrystalline silicon formed by Confined Lateral Selective Epitaxial Overgrowth (CLSEG).

3. The double DRAM cell as recited in claim 1 and wherein:
   the first storage capacitor (C1) is a trench capacitor formed in the substrate.

4. The double DRAM cell as recited in claim 1 and wherein:
   the second storage capacitor (C2) is stacked on the second transistor (T2).

5. The double DRAM cell as recited in claim 1 and wherein:
   the seed contact connects to a drain of the first transistor (T1).

6. The double DRAM cell as recited in claim 1 and wherein:
   a first plate of the second storage capacitor (C2) connects to a source of the second transistor (T2).

7. The double DRAM cell as recited in claim 1 and wherein:
   the intermediate substrate is monocrystalline silicon formed by Confined Lateral Selective Epitaxial Overgrowth (CLSEG) including the steps of:
   a. depositing a thick sacrificial layer on the first insulating layer and planarizing the sacrificial layer to form a planarized sacrificial block insulated from the first transistor.
   b. depositing an oxide layer over the sacrificial block and forming an opening to the sacrificial block;
   c. etching away the sacrificial block utilizing the opening to form a cavity; and
   d. epitaxially growing a monocrystalline silicon within the cavity to form the intermediate substrate.

8. The double DRAM cell as recited in claim 1 and wherein:
   the sacrificial block is formed of nitride.

9. The double DRAM cell as recited in claim 1 and wherein:
   the first and second transistors are p-n-p devices.

10. The double DRAM cell as recited in claim 1 and wherein:
    the first and second transistors are n-p-n devices.

11. A double DRAM cell comprising: a silicon substrate;
    a first access transistor (T1) formed on the silicon substrate including a doped source and a doped drain;
    a word line (WL1) for the first transistor (T1) formed on the substrate and insulated by oxide spacers and top and bottom oxide layers;
    an insulating oxide layer deposited over the first access transistor;
    a seed contact formed through the insulating oxide layer to the drain of the first access transistor (T1);
    an intermediate silicon substrate formed over the insulating oxide layer to the seed contact by a Confined Lateral Selective Epitaxial Overgrowth (CLSEG) process including the steps of:
    a. depositing a thick sacrificial layer over the insulating oxide layer;
    b. planarizing the sacrificial layer to form a planarized sacrificial block;
    c. depositing an oxide layer over the sacrificial block and forming an opening to the sacrificial block;
    d. etching away the sacrificial block utilizing the opening to form a cavity; and
    e. epitaxially growing a monocrystalline silicon within the cavity to form the intermediate substrate;
    a second access transistor (T2) formed by doping source and drain regions on the intermediate substrate with the drain of the second access transistor (T2) overlying the drain of the first access transistor (T1);
    an insulated bit line deposited over the drain of the second access transistor (T2);
    a second word line (WL2) for the second access transistor (T2) formed upon and insulted from the intermediate substrate;
    a first storage capacitor (C1) connected to the source of the first access transistor (T1); and
    a second storage capacitor (C2) connected to the source of the second access transistor (T2).

12. The double DRAM cell as recited in claim 11 and wherein:
    the first storage capacitor (C1) is a trench capacitor formed in the silicon substrate.

13. The double DRAM cell as recited in claim 12 and wherein:
    the second storage capacitor (C2) is stacked upon the second access transistor with a first plate connected to the source of the second access transistor (T2) and a second plate stacked upon the first plate and separated by a dielectric material from the first plate.

14. The double DRAM cell as recited in claim 11 and wherein:
    the source and drain of the first access transistor are separated by a silicon substrate extension and the first word line (WL1) is formed on top of and insulated from the silicon. substrate extension.

15. The double DRAM cell as recited in claim 14 and wherein:

the source and drain of the second access transistor are separated by an intermediate silicon substrate extension and the second word line (WL2) is formed on top of and insulated from the intermediate silicon substrate extension.

16. The double DRAM cell as recited in claim 11 and wherein:
   the sacrificial layer is formed of a nitride layer approximately 4000 to 6000 Å thick.

* * * * *